(12) United States Patent
Sakui et al.

(10) Patent No.: US 11,355,166 B2
(45) Date of Patent: *Jun. 7, 2022

(54) SEQUENTIAL MEMORY OPERATION WITHOUT DEACTIVATING ACCESS LINE SIGNALS

(71) Applicant: Micron Technology, Inc., Boise, ID (US)

(72) Inventors: Koji Sakui, Setagayaku (JP); Peter Sean Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

This patent is subject to a terminal disclaimer.

(21) Appl. No.: 17/175,999

(22) Filed: Feb. 15, 2021

(65) Prior Publication Data
US 2021/0257008 A1    Aug. 19, 2021

Related U.S. Application Data

(60) Continuation of application No. 16/670,480, filed on Oct. 31, 2019, now Pat. No. 10,923,163, which is a
(Continued)

(51) Int. Cl.
*G11C 7/06* (2006.01)
*G11C 16/04* (2006.01)
(Continued)

(52) U.S. Cl.
CPC ............. *G11C 7/065* (2013.01); *G11C 7/067* (2013.01); *G11C 7/106* (2013.01); *G11C 7/12* (2013.01); *G11C 7/22* (2013.01); *G11C 16/0483* (2013.01); *G11C 16/26* (2013.01); *G11C 2207/108* (2013.01)

(58) Field of Classification Search
CPC ..... G11C 7/065; G11C 16/0483; G11C 7/106; G11C 7/22; G11C 16/26; G11C 7/12; G11C 7/067; G11C 2207/108
See application file for complete search history.

(56) References Cited

U.S. PATENT DOCUMENTS 5,208,773 A    5/1993  Okitaka et al.
6,009,040 A   12/1999  Choi et al.
(Continued)

OTHER PUBLICATIONS

U.S. Appl. No. 13/868,548, Restriction Requirement dated Jan. 2, 2015, 6 pgs.
(Continued)

*Primary Examiner* — Connie C Yoha
(74) *Attorney, Agent, or Firm* — Schwegman Lundberg & Woessner, P.A.

(57) ABSTRACT

Some embodiments include apparatuses and methods for activating a signal associated with an access line coupled to different groups of memory cells during a memory operation of a device, and for sensing data lines of the device during different time intervals of the memory operation to determine the value of information stored in the memory cells. Each of the data lines can be coupled to a respective memory cell of each of the groups of memory cells. In at least one of such apparatuses and methods, the signal applied to the access line can remain activated during the memory operation.

20 Claims, 10 Drawing Sheets

Related U.S. Application Data division of application No. 14/954,625, filed on Nov. 30, 2015, now Pat. No. 10,497,406, which is a division of application No. 13/868,548, filed on Apr. 23, 2013, now Pat. No. 9,208,833.

(51) Int. Cl.

| | |
|---|---|
| *G11C 16/26* | (2006.01) |
| *G11C 7/10* | (2006.01) |
| *G11C 7/12* | (2006.01) |
| *G11C 7/22* | (2006.01) |

(56) References Cited

U.S. PATENT DOCUMENTS

| | | | |
|---|---|---|---|
| 6,288,959 | B1 | 9/2001 | OuYang et al. |
| 7,405,977 | B2 | 7/2008 | Lee et al. |
| 8,009,470 | B2 | 8/2011 | Iwai et al. |
| 8,120,953 | B2 | 2/2012 | Tanaka |
| 8,154,923 | B2 | 4/2012 | Li et al. |
| 8,159,876 | B2 | 4/2012 | Tsao et al. |
| 9,208,833 | B2 | 12/2015 | Sakui et al. |
| 9,530,492 | B2 | 12/2016 | Lee |
| 10,497,406 | B2 | 12/2019 | Sakui et al. |
| 10,923,163 | B2 * | 2/2021 | Sakui ............... G11C 16/26 |
| 2002/0145933 | A1 | 10/2002 | Nakagawa |
| 2003/0156455 | A1 | 8/2003 | Nakamura et al. |
| 2006/0140007 | A1 | 6/2006 | Cernea et al. |
| 2008/0056021 | A1 | 3/2008 | Kobayashi |
| 2008/0310230 | A1 | 12/2008 | Kim et al. |
| 2010/0034022 | A1 | 2/2010 | Dutta et al. |
| 2010/0034039 | A1 | 2/2010 | Shimogawa et al. |
| 2010/0149871 | A1 | 6/2010 | Tanaka |
| 2013/0028024 | A1 | 1/2013 | Tanzawa |
| 2013/0215685 | A1 | 8/2013 | Chand Sk |
| 2013/0223127 | A1 | 8/2013 | Park et al. |
| 2014/0003157 | A1 | 1/2014 | Mui et al. |
| 2014/0313839 | A1 | 10/2014 | Sakui et al. |
| 2016/0086641 | A1 | 3/2016 | Sakui et al. |
| 2016/0172037 | A1 | 6/2016 | Lee |
| 2017/0092371 | A1 * | 3/2017 | Harari ............... H01L 29/66833 |
| 2020/0066311 | A1 | 2/2020 | Sakui et al. |

OTHER PUBLICATIONS

U.S. Appl. No. 13/868,548, Response filed Mar. 2, 2015 to Restriction Requirement dated Jan. 2, 2015, 6 pgs.
U.S. Appl. No. 13/868,548, Non Final Office Action dated Apr. 7, 2015, 11 pgs.
U.S. Appl. No. 13/868,548, Response filed Jul. 1, 2015 to Non Final Office Action dated Apr. 7, 2015, 8 pgs.
U.S. Appl. No. 13/868,548, Notice of Allowance dated Aug. 3, 2015, 5 pgs.
U.S. Appl. No. 14/954,625, Non Final Office Action dated Aug. 24, 2016, 18 pgs.
U.S. Appl. No. 14/954,625, Response filed Nov. 23, 2016 to Non Final Office Action dated Aug. 24, 2016, 14 pgs.
U.S. Appl. No. 14/954,625, Final Office Action dated Mar. 9, 2017, 17 pgs.
U.S. Appl. No. 14/954,625, Response filed May 9, 2017 to Final Office Action dated Mar. 9, 2017, 13 pgs.
U.S. Appl. No. 14/954,625, Advisory Action dated Jun. 5, 2017, 3 pgs.
U.S. Appl. No. 14/954,625, Non Final Office Action dated Nov. 14, 2017, 23 pgs.
U.S. Appl. No. 14/954,625, Response filed Feb. 14, 2018 to Non Final Office Action dated Nov. 14, 2017, 13 pgs.
U.S. Appl. No. 14/954,625, Final Office Action dated Oct. 1, 2018, 12 pgs.
U.S. Appl. No. 14/954,625, Response filed Nov. 15, 2018 to Final Office Action dated Oct. 1, 2018, 11 pgs.
U.S. Appl. No. 14/954,625, Advisory Action dated Dec. 28, 2018, 2 pgs.
U.S. Appl. No. 14/954,625, Response filed Jan. 10, 2019 to Final Office Action dated Oct. 1, 2018 and Advisory Action dated Dec. 28, 2018, 11 pgs.
U.S. Appl. No. 14/954,625, Notice of Allowance dated Jul. 11, 2019, 9 pgs.
U.S. Appl. No. 14/954,625, 312 Amendment filed Oct. 10, 2019, 9 pgs.
U.S. Appl. No. 14/954,625, PTO Response to Rule 312 Communication dated Oct. 25, 2019, 2 pgs.
U.S. Appl. No. 16/670,480, Preliminary Amendment Filed Nov. 1, 2019, 7 pgs.
U.S. Appl. No. 16/670,480, Non Final Office Action dated Jun. 25, 2020, 7 pgs.
U.S. Appl. No. 16/670,480, Response filed Sep. 24, 2020 to Non Final Office Action dated Jun. 25, 2020, 8 pgs.
U.S. Appl. No. 16/670,480, Notice of Allowance dated Oct. 2, 2020, 5 pgs.
U.S. Appl. No. 16/670,480, Notice of Allowance dated Oct. 6, 2020, 4 pgs.
U.S. Appl. No. 16/670,480, 312 Amendment filed Jan. 4, 2021, 7 pgs.
U.S. Appl. No. 16/670,480, PTO Response to Rule 312 Communication dated Jan. 12, 2021, 2 pgs.

* cited by examiner

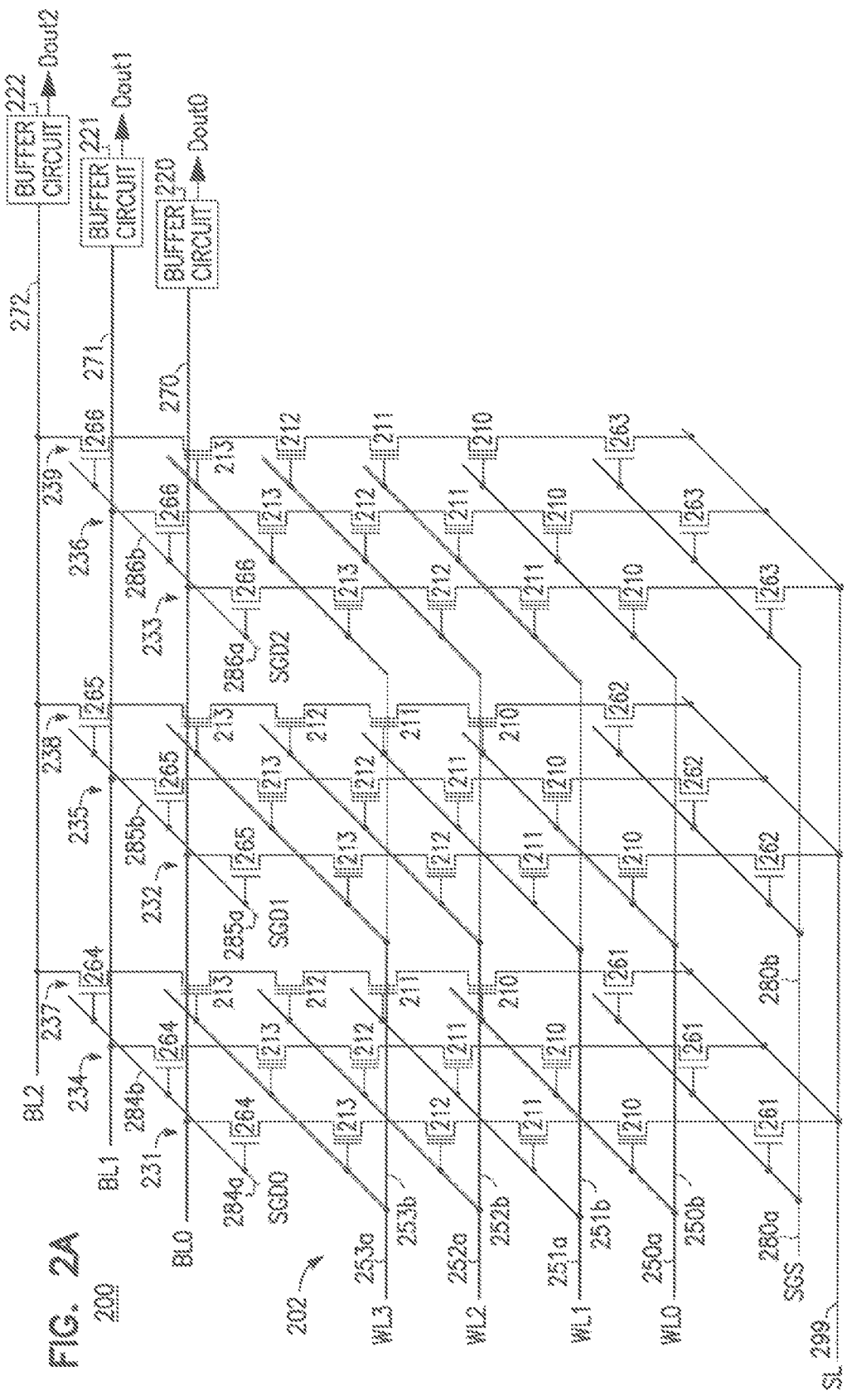

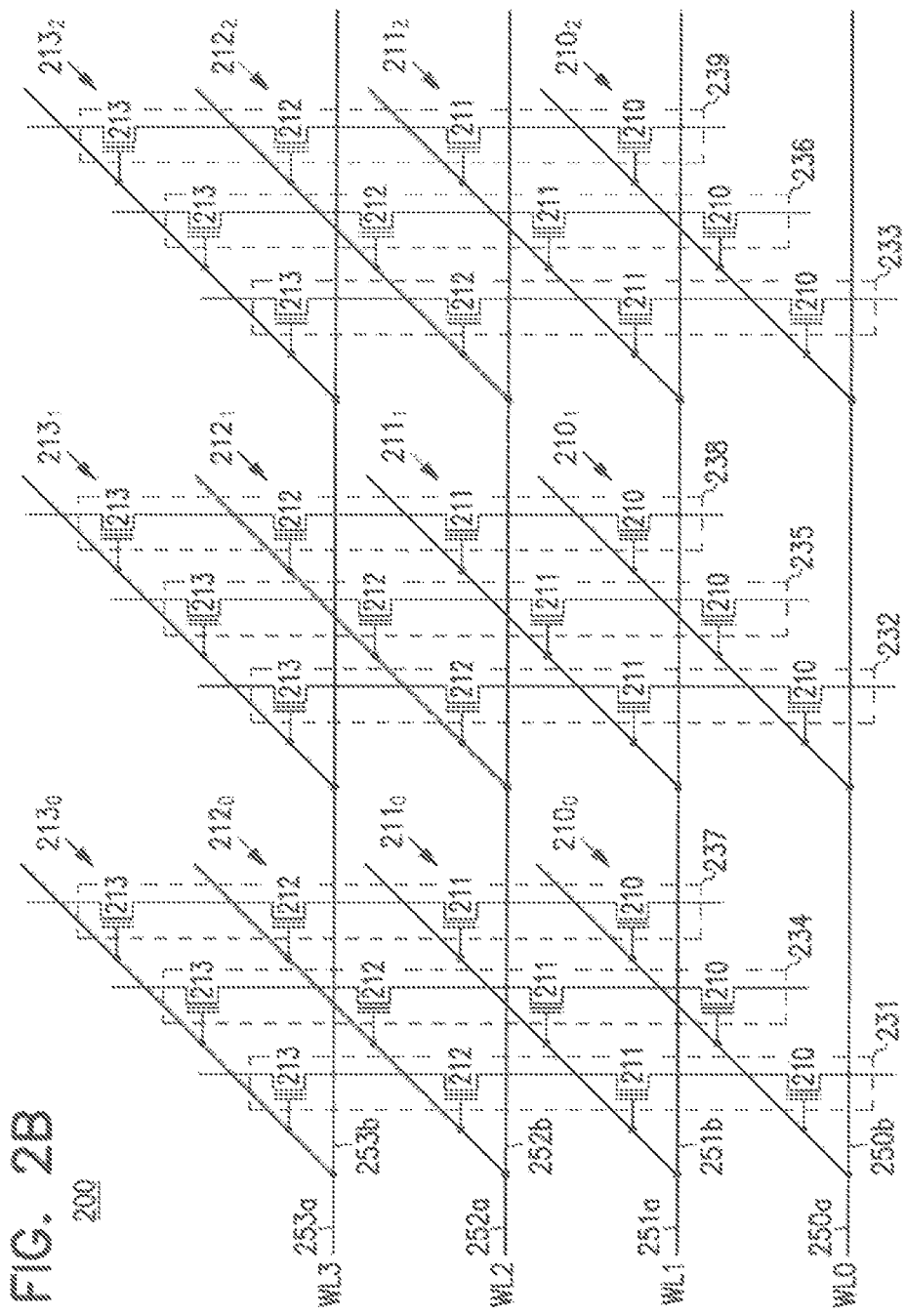

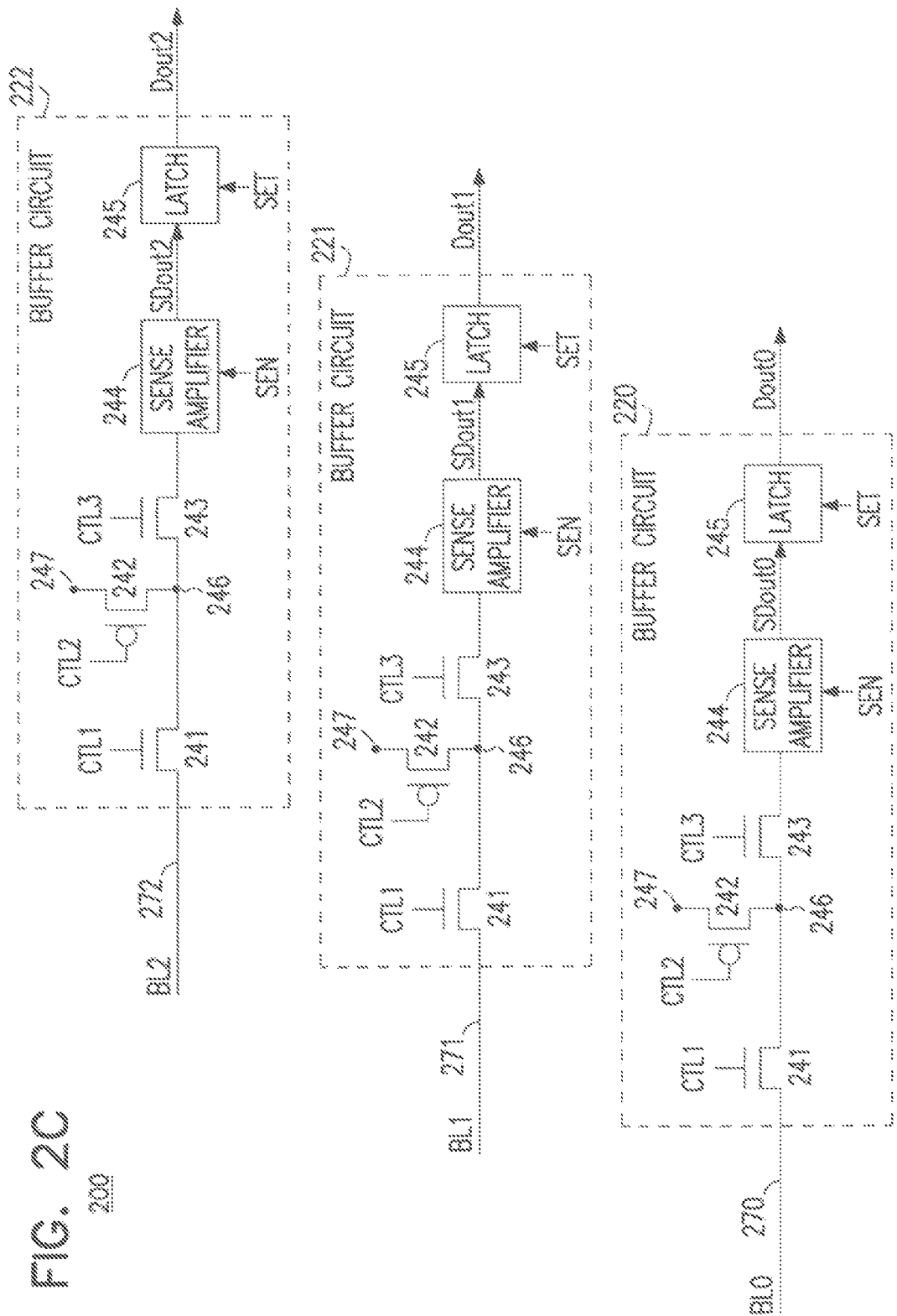

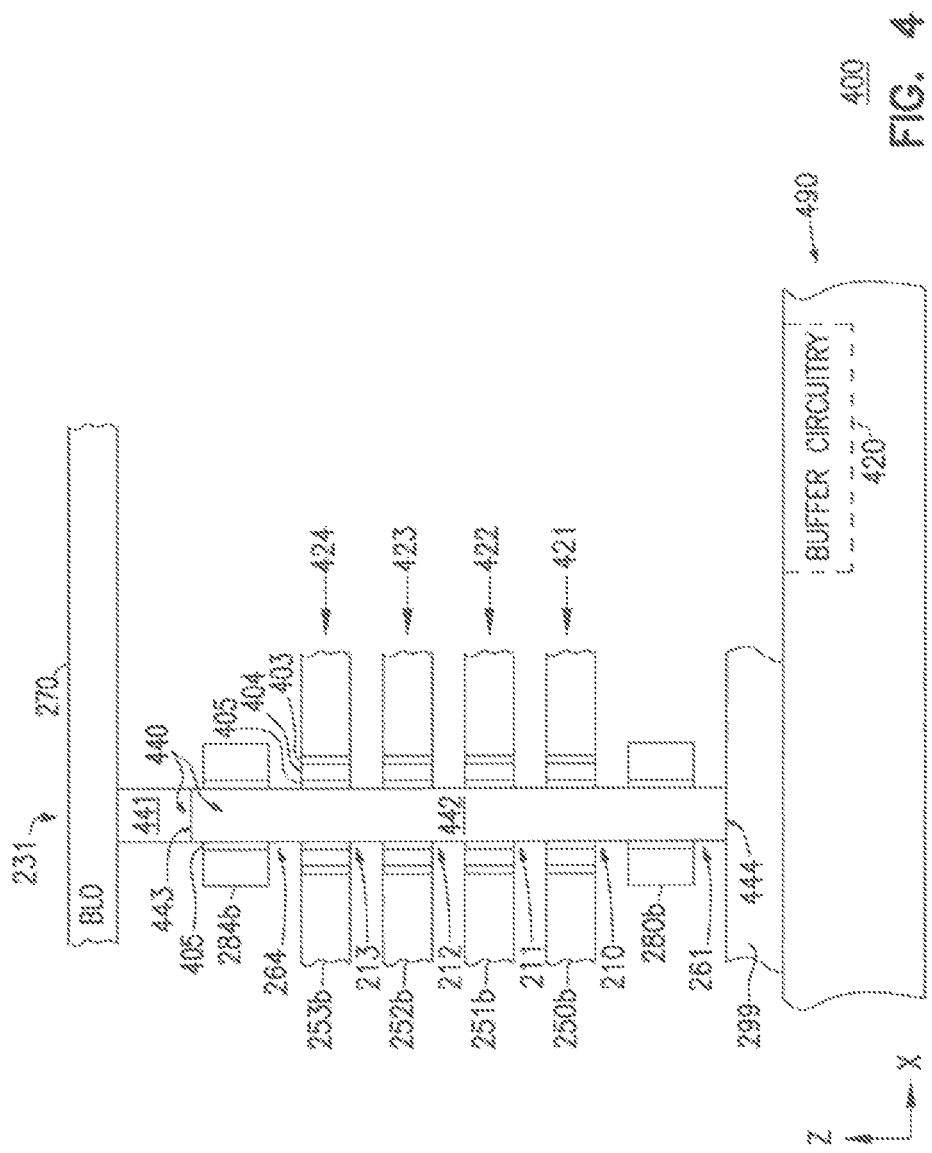

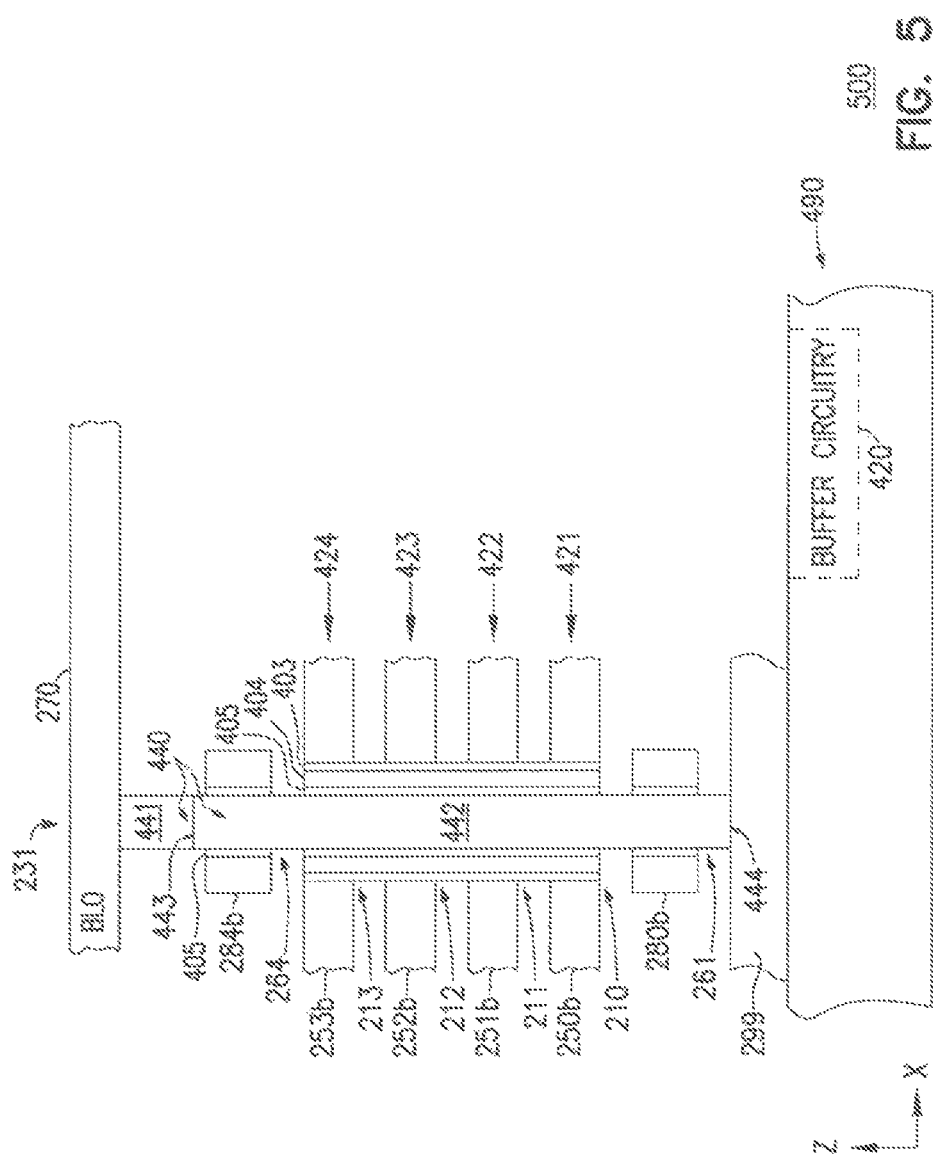

US 11,355,166 B2

SEQUENTIAL MEMORY OPERATION WITHOUT DEACTIVATING ACCESS LINE SIGNALS

PRIORITY APPLICATION

This application is a continuation of U.S. application Ser. No. 16/670,480, filed Oct. 31, 2019, which is a divisional of U.S. application Ser. No. 14/954,625, filed Nov. 30, 2015, now issued as U.S. Pat. No. 10,497,406, which is a divisional of U.S. application Ser. No. 13/868,548, filed Apr. 23, 2013, now issued as U.S. Pat. No. 9,208,833, all of which are incorporated herein by reference in their entirety.

BACKGROUND

Memory devices, such as flash memory, are widely used in computers and many electronic items. A memory device usually has numerous memory cells. Information can be stored in the memory cells in a write operation. The stored information can be obtained from the memory cells in a read operation. The memory device can also have circuitry to access the memory cells. In a memory operation, such as a read or write operation, signals can be applied to elements in the circuitry for memory operation. In some conventional memory operations, if such signals are poorly controlled, undesirable factors, including increased power consumption, increased memory operation time, or both, may occur.

BRIEF DESCRIPTION OF THE DRAWINGS

FIG. 2A shows a schematic diagram of a portion of a memory device including buffer circuits coupled to data lines, according to an embodiment of the invention.

FIG. 2B is a schematic diagram of a portion of the memory device FIG. 2A showing groups of memory cells, according to an embodiment of the invention.

FIG. 2C shows a schematic diagram of the buffer circuits of the memory device of FIG. 2A, according to an embodiment of the invention.

FIG. 4 shows a side view of a structure of a portion of a memory device including memory cells arranged in different levels of the device, according to an embodiment of the invention.

FIG. 5 shows a variation of the memory device of FIG. 4, according to an embodiment of the invention.

DETAILED DESCRIPTION

Figure 1:
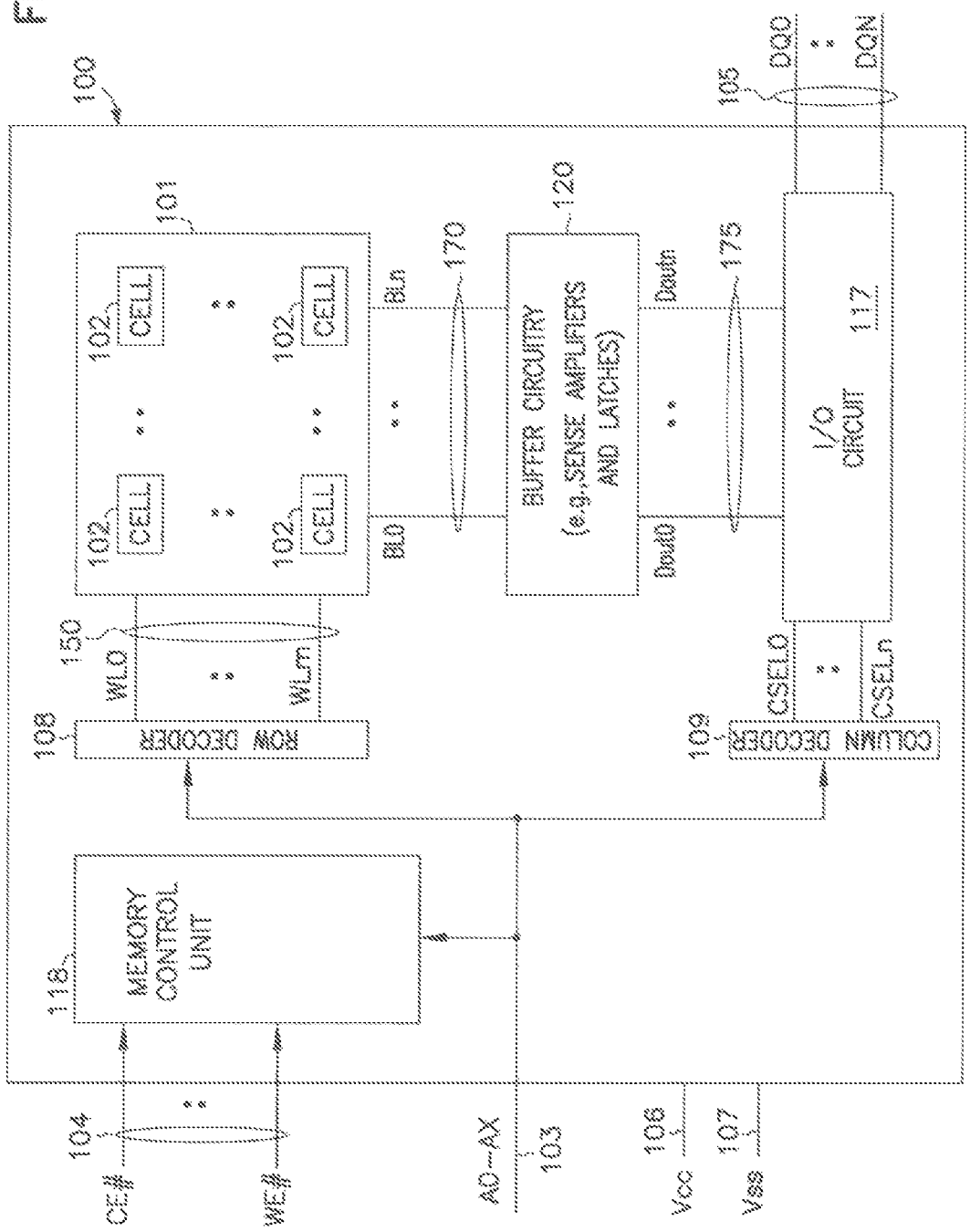
FIG. 1 shows a block diagram of an apparatus in the form of a memory device having a memory array, memory cells, access lines, and data lines, according to an embodiment of the invention.

FIG. 1 shows a block diagram of an apparatus in the form of a memory device 100 having a memory array 101, memory cells 102, access lines 150, and data lines 170, according to an embodiment of the invention. Access lines 150 can include word lines of memory device 100 and can be configured to carry signals (e.g., word line signals) WL0 through WLm. Data lines 170 can include bit lines of memory device 100 and can be configured to can carry signals (e.g., bit line signals) BL0 through BLn.

Memory device 100 may use access lines 150 to access memory cells 102 during memory operations, and use data lines 170 to exchange information (e.g., data) with memory cells 102. A row decoder 108 and a column decoder 109 decode address signals A0 through AX on lines 103 (e.g., address lines) to determine which memory cells 102 are to be accessed in a memory operation.

Memory device 100 can perform memory operations such as a read operation to obtain information stored in memory cells 102 and a write (e.g., programming) operation to write (e.g., program) information to memory cells 102. Memory device 100 can also perform an erase operation to clear information from some or all of memory cells 102.

A memory control unit 118 can be configured to control memory operations of memory device 100 based on control signals on lines 104. Examples of the control signals on lines 104 include one or more clock signals and other signals (e.g., a chip enable signal CE #, a write enable signal WE # to indicate which operation (e.g., read, write, or erase operation) memory device 100 can perform.

Other devices external to memory device 100 (e.g., a memory access device, such as a processor or a memory controller) can control the values of the control signals on lines 104. Specific values of a combination of the signals on lines 104 can produce a command (e.g., read, write, or erase command) that can cause memory device 100 to perform a corresponding memory operation (e.g., read, write, or erase operation).

Memory device 100 can include buffer circuitry (e.g., a page buffer circuit) 120 that can include components such as sense amplifiers and latches (e.g., data latches). Buffer circuitry 120 can be configured to determine the value of information stored in memory cells 102 (e.g., during a read operation) and provide the value of the information in the form of signals Dout0 through Doutn to lines 175 (e.g., part of data lines of memory device 100). Buffer circuitry 120 can also use the signals on lines 175 to determine the value of information to be stored (e.g., programmed) in memory cells 102 (e.g., during a write operation).

Memory device 100 can include an input/output (I/O) circuit 117 to exchange information between memory array 101 and lines (e.g., I/O lines) 105. Column decoder 109 can selectively activate the CSEL0 through CSELn signals based on address signals A0 through AX on lines 103. I/O circuit 117 can respond to signals CSEL0 through CSELn to select the signals on lines 175 that can represent the information obtained from or written to memory cells 102.

Signals DQ0 through DQN on lines 105 can represent information obtained from or written in memory cells 102. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Each of memory cells 102 can be configured to store information representing a value of a fraction of a bit, a value of a single bit, or a value of multiple bits such as two, three, four, or another number of bits. For example, each of memory cells 102 can be configured to store information representing a binary value "0" or "1" of a single bit (single level cell or SLC). The single bit per cell is sometimes called a single level cell. In another example, each of memory cells 102 can be configured to store information representing a value for multiple bits (multi-level cell or MLC), such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can receive supply voltages Vcc and Vss, on lines 106 and 107, respectively. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Memory device 100 can include a non-volatile memory device, and memory cells 102 can include non-volatile memory cells, such that memory cells 102 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive random access memory (RAM) device).

Memory device 100 can include a memory device where memory cells 102 can be physically located in multiple levels on the same device, such that some of memory cells 102 can be stacked over some other memory cells 102 in multiple levels over a substrate (e.g., a semiconductor substrate) of memory device 100.

One of ordinary skill in the art may recognize that memory device 100 may include other elements, several of which are not shown in FIG. 1 so as not to obscure the embodiments described herein.

Memory device 100 may include memory devices and operate using memory operations (e.g., read, write, and erase operations) similar to or identical to memory devices and operations described below with reference to FIG. 2A through FIG. 6.

FIG. 2A shows a schematic diagram of a portion of a memory device 200 including buffer circuits 220, 221, and 222 coupled to data lines 270, 271, and 272, according to an embodiment of the invention. Buffer circuits 220, 221, and 222 can be part of buffer circuitry of memory device 200 that can correspond to buffer circuitry 120 of FIG. 1. During a memory operation (e.g., a read operation), buffer circuits 220, 221, and 222 can operate to determine the value of information stored in memory cells 210, 211, 212, and 213. Buffer circuits 220, 221, and 222 can provide the value of information, in the form of signals Dout0, Dout1, and Dout2, to an I/O circuit (not shown in FIG. 2A) of memory device 200. Such an I/O circuit of memory device 200 can be similar to or identical to I/O circuit 117 of FIG. 1.

As shown in FIG. 2A, data lines 270, 271, and 272 can carry signals BL0, BL1, and BL2, respectively. Each of data lines 270, 271, and 272 can be structured as a conductive line of memory device 200. Memory device 200 can include line 299, which can be structured as a conductive line that can form part of a source (e.g., a source line) of memory device 200. Line 299 can carry a signal SL (e.g., source line signal). Memory device 200 can include access lines 250a, 251a, 252a, and 253a that can carry corresponding signals WL0, WL1, WL2, and WL3. Memory device 200 can include control gates 250b, 251b, 252b, and 253b that can be part of access lines 250a, 251a, 252a, and 253a, respectively. FIG. 2A shows four access lines 250a, 251a, 252a, and 253a and three data lines 270, 271, and 272 as an example. The number of such access lines and data lines can vary.

Memory device 200 can include a memory array 202 having memory cells 210, 211, 212, and 213, and select transistors 261, 262, 263, 264, 265, and 266. Memory cells 210, 211, 212, and 213 can be arranged in memory cell strings, such as memory cell strings 231 through 239.

Each memory cell string in memory device 200 can be coupled to one of data lines 270, 271, and 272 through one of select transistors 264, 265, and 266. Each memory cell string in memory device 200 can also be coupled to line 299 through one of select transistors 261, 262, and 263. For example, memory cell string 231 can be coupled to data line 270 through transistor 264 (directly over string 231) and to line 299 through transistor 261 (directly under string 231). In another example, memory cell string 232 can be coupled to data line 270 through transistor 265 (directly over string 232) and to line 299 through transistor 262 (directly under string 232). FIG. 2A shows an example of nine memory cell strings 231 through 239 and four memory cells 210, 211, 212, and 213 in each memory cell string. The number of such memory cell strings and the number of memory cells in each memory cell string can vary.

As shown in FIG. 2A, some memory cells (e.g., 213) of different memory cell strings (e.g., 231 through 239) can share the same control gate (e.g., 253b). Some other memory cells (e.g., 212) of these memory cell strings (e.g., 231 through 239) can share another control gate (e.g., 252b). Each of control gates 250b, 251b, 252b, and 253b can be structured as a single conductive plate.

As shown in FIG. 2A, select transistors 261, 262, and 263 can share the same gate 280b. Gate 280b can form part of a select line (e.g., source select line) 280a of memory device 200. Select transistors 261, 262, and 263 can be controlled (e.g., turned on or turned off) by the same signal, such as an SGS signal (e.g., source select gate signal) applied to select line 280a. During a memory operation, such as a read or write operation, select transistors 261, 262, and 263 can be turned on (e.g., by activating SGS signal) to couple memory cell strings 231 through 239 to line 299. Select transistors 261, 262, and 263 can be turned off (e.g., by deactivating the SGS signal) to decouple the memory cell strings 231 through 239 from line 299.

Select transistors 264, 265, and 266 can include separate gates (e.g., separate drain select gates) 284b, 285b, and 286b. However, select transistors 264 can share the same gate 284b. Select transistors 265 can share the same gate 285b. Select transistors 266 can share the same gate 286b. Gates 284b, 285b, and 286b can form part of select lines (e.g., drain select lines) 284a, 285a, and 286a, respectively, of memory device 200.

Select transistors 264, 265, and 266 can be controlled (e.g., turned on or turned off) by corresponding signals SGD0, SGD1, SGD2. (e.g., drain select gate signals) during a memory operation (e.g., a read or write operation) in order to selectively couple the memory cell strings of memory device 200 to their respective data lines 270, 271, and 272. During a memory operation (e.g., a read or write operation), only one of the signals SGD0, SGD1, and SGD2 can be activated at a time (e.g., sequentially activated).

For example, during a memory operation, signal SGD0 can be activated to turn on transistors 264 and couple memory cell strings 231, 234, and 237 to data lines 270, 271, and 272, respectively. Signals SGD1 and SGD2 can be deactivated (while signal SGD0 is activated) to decouple memory cell strings 232, 235, 238, 233, 236, and 239 from data lines 270, 271, and 272. In this example, buffer circuits 220, 221, 222 can operate to determine the values of information stored in selected memory cells of memory cell strings 231, 234, and 237 (associated with the activated signal SGD0).

In another example, during a memory operation, signal SGD1 can be activated to turn on transistors 265 and couple memory cell strings 232, 235, and 238 to data lines 270, 271, and 272, respectively. Signals SGD0 and SGD2 can be deactivated (while signal SGD1 is activated) to decouple memory cell strings 231, 234, 237, 233, 236, and 239 from data lines 270, 271, and 272. In this example, buffer circuits 220, 221, 222 can operate to determine the values of information stored in selected memory cells of memory cell strings 232, 235, and 238 (associated with the activated signal SGD1).

Memory cells 210, 211, 212, and 213 can arranged such that they can be physically located in multiple levels of memory device 200, such that memory cells 210, 211, 212, and 213 in the same memory cell string can be stacked over each other (stacked memory cells) in multiple levels of memory device 200. FIG. 4 and FIG. 5 show example structures of memory devices having stacked memory cells that can correspond to memory cells 210, 211, 212, and 213 of memory device 200.

FIG. 2B is a schematic diagram of a portion of memory device 200 of FIG. 2A showing groups of memory cells 210, 211, 212, and 213, according to an embodiment of the invention. As shown in FIG. 2B, memory cells 213 can be grouped into groups $213_0$, groups $213_1$, and groups $213_2$. Memory cells 212 can be grouped into groups $212_0$, groups $212_1$, and groups $212_2$. Memory cells 211 can be grouped into groups $211_0$, groups $211_1$, and groups $211_2$. Memory cells 210 can be grouped into groups $210_0$, groups $210_1$, and groups $210_2$. Each group of memory cells can correspond to one or more pages in a block of memory cells of memory device 200. For example, if memory device 200 is configured as an SLC (single level cell) memory device, then each group (e.g., group $213_0$) of memory cells can correspond to one page in a block of memory cells of memory device 200. In another, if memory device 200 is configured as an MLC (multi-level cell, such as two or more bits per cell) memory device, then each group (e.g., group $213_0$) of memory cells can correspond to multiple (e.g., two or more) pages in a block of memory cells of memory device 200. FIG. 2B shows an example of 12 groups of memory cells where each group includes three memory cells. The number of groups of memory cells and the number of memory cells in each group can vary. For example, memory device 200 can include hundreds or thousands of pages in a block of memory cells.

Each memory cell group can include one memory cell from a different memory string. For example, group $213_0$ of memory cells 213 can include memory cells 213 from memory cell strings 231, 234, and 237 (coupled to select line 284a and access line 253a in FIG. 2A). Group $213_1$ of memory cells 213 can include memory cells 213 from memory cell strings 232, 235, and 238 (coupled to select line 285a and access line 253a in FIG. 2A). Group $213_2$ of memory cells 213 can include memory cells 213 from memory cell strings 233, 236, and 239 (coupled to select line 286a and access line 253a in FIG. 2A).

In another example, group $212_0$ of memory cells 212 can include memory cells 212 from memory cell strings 231, 234, and 237 (coupled to select line 284a and access line 252a in FIG. 2A). Group $212_1$ of memory cells 212 can include memory cells 212 from memory cell strings 232, 235, and 238 (coupled to select line 285a and access line 252a in FIG. 2A). Group $212_2$ of memory cells 212 can include memory cells 212 from memory cell strings 233, 236, and 239 (coupled to select line 286a and access line 252a in FIG. 2A).

During a memory operation (e.g., a read operation), only one of the access lines (e.g., 252a) can be selected at a time. The other access lines (e.g., 250a, 251a, and 253a) can be unselected access lines. Selecting a particular access line can include activating (e.g., applying) the signal (e.g., WL2) associated with that particular access line, such that the signal can be at a particular level (e.g., voltage level). Only one of the groups of memory cells (e.g., $212_0$) coupled to the selected access line (e.g., 252a) can be a selected group of memory cells during a particular time interval of a memory operation. Selecting a group of memory cells can include activating the signal (e.g., SGD0 in FIG. 2A) associated with a select line (e.g., 284a) coupled to that group (e.g., $212_0$) of memory cells. The memory cells (e.g., 212) from the selected group (e.g., $212_0$) can be concurrently sensed by buffer circuits 220, 221, and 220 (FIG. 2A). Based on the sensed information, buffer circuits 220, 221, and 220 can determine the values information stored in the memory cells of the selected group (e.g., $212_0$).

The groups of memory cells coupled to the selected access line (e.g., 252a) can be selected one group after another (e.g., in a sequential order). For example, during a memory operation, if access line 252a is a selected access line, then groups $212_0$, $212_1$, and $212_2$ of memory cells 212 can be selected in sequential order. In this example, group $212_0$ can be selected (e.g., by activating signal SGD0), then group $212_1$ can be selected (e.g., by activating signal SGD1), and group $212_2$ can be selected (e.g., by activating signal SGD2) after group $212_1$ is selected. Thus, in this example, buffer circuits 220, 221, and 222 (FIG. 2A) can sense data lines 270, 271, and 272 and sequentially obtain information (e.g., one group at a time) from groups $212_0$, $212_1$, and $212_2$ of memory cells 212.

FIG. 2C shows a schematic diagram of buffer circuits 220, 221, and 222 of FIG. 2A, according to an embodiment of the invention. Buffer circuits 220, 221, and 222 can include similar or identical elements (e.g., transistors, sense amplifiers, and latches) and operate in a manner similar to or identical to each other. Similar or identical elements among buffer circuits 220, 221, and 222 are given the same designation labels. For simplicity, detailed description of elements and operation of only buffer circuit 220 are described.

As shown in FIG. 2C, buffer circuit 220 can include elements, such as transistors 241, 242, and 243, a sense amplifier 244, and a latch (e.g., data latch) 245. FIG. 2C shows an example where these elements are arranged in a single unit (e.g., in the same buffer circuit 220). Some of these elements, however, can be arranged in multiple units separated from buffer circuit 220.

Transistors 241, 242, and 243 can respond to signals CTL1, CTL2, and CTL3, respectively, such that transistors 241, 242, and 243 can be turned on or turned off based on the levels (e.g., voltage level) of respective signals CTL1, CTL2, and CTL3. Transistors 241 and 242 can include n-channel transistors. Transistor 243 can include a p-channel transistor.

Transistor 241 can operate to couple data line 270 to other elements of buffer circuit 220 (including sense amplifier 244) during a read or write operation. Transistor 241 can also operate as a buffer transistor during an erase operation of memory device 200. Transistor 242 can operate as a load (e.g., load transistor) when it is turned on and can provide (e.g., can source) a current from node 247 to data line 270 through node 246 during sensing of data line 270. Node 247 can be provided with a voltage, such as Vcc or another voltage having a positive value (e.g., about 1.5V to 2V). Transistor 243 can operate as a transfer gate (e.g., a pass transistor) when it is turned on to allow sense amplifier 244 to sense data line 270.

Sense amplifier 244 of buffer circuit 220 can respond to a signal SEN (e.g., sense amplifier enable signal) to sense data line 270 during a particular time interval of a memory operation (e.g., a read operation). Sense amplifier 244 can provide sensed information in the form of a signal SDout0 (e.g., sense output signal). Signal SDout0 can have different levels, depending on the level of signal BL0 on data line 270 sensed by sense amplifier 244. The level of signal SDout0 can be used to determine the value of information (e.g., state) stored in a memory cell of a selected group of memory cells (e.g., a memory cell from one of memory cell strings 231, 232, and 233) coupled to data line 270.

Latch 245 of buffer 220 can include a storage element (e.g., static memory) to latch (e.g., temporary store) the value of information on data line 270 sensed by sense amplifier 244. The value of information stored by latch 245 can depend on the level of signal SDout0 received by latch 245. The value of information stored by latch 245 can be provided to an I/O circuit (not shown) of memory device 200 in the form of signal Dout0. The levels of signal Dout0 can correspond to a binary value (e.g., logic "0" or logic "1"). Latch 245 can respond to a signal SET. Memory device 200 can activate signal SET to set latch 245 to its initial state (e.g., zero) after each time latch 245 provides signal Dout0 to the circuit of memory device 200.

As shown in FIG. 2C, each of buffer circuits 221 and 222 can include transistors 241, 242, 243, sense amplifier 244, and latch 245 similar to or identical to those of buffer circuit 220.

Each of buffer circuits 221 and 222 can operate in a manner similar to that of buffer circuit 220. For example, in buffer circuit 221, sense amplifier 244 can operate to sense data line 271 and provide sensed information in the form of a signal SDout1. Signal SDout1 can have different levels, depending on the level of signal BL1 on data line 271 sensed by sense amplifier 244 of buffer circuit 221. Latch 245 of buffer circuit 221 can provide signal Dout1 having a level based on the level of signal SDout1. In buffer circuit 222, sense amplifier 244 can operate to sense data line 272 and provide sensed information in the form of a signal SDout2. Signal SDout2 can have different levels, depending on the level of signal BL2 on data line 272 sensed by sense amplifier 244 of buffer circuit 222. Latch 245 of buffer circuit 222 can provide signal Dout2 having a level based on the level of signal SDout2.

Buffer circuits 220, 221, and 222 can operate to sense (e.g., concurrently sense) respective data lines 270, 271, and 272. For example, during a memory operation (e.g., a read operation) of obtaining information stored in group $212_0$ of memory cells 212 (FIG. 2B), sense amplifiers 244 of buffer circuits 220, 221, and 222 can sense (e.g., concurrently sense) respective data lines 270, 271, and 272 and provide corresponding signals SDout0, SDout1, and SDout2. In this example, the level of signal SDout0 can be based on the value of information (e.g., state) stored in memory cell 212 of memory cell string 231 (one of memory cells 212 in group $212_0$ in FIG. 2B). The level of signal SDout1 can be based on the value of information (e.g., state) stored in memory cell 212 of memory cell string 234 (one of memory cells 212 in group $212_0$). The level of signal SDout2 can be based on the value of information (e.g., state) stored in memory cell 212 of memory cell string 237 (one of memory cells 212 in group $212_0$).

Figure 3A:
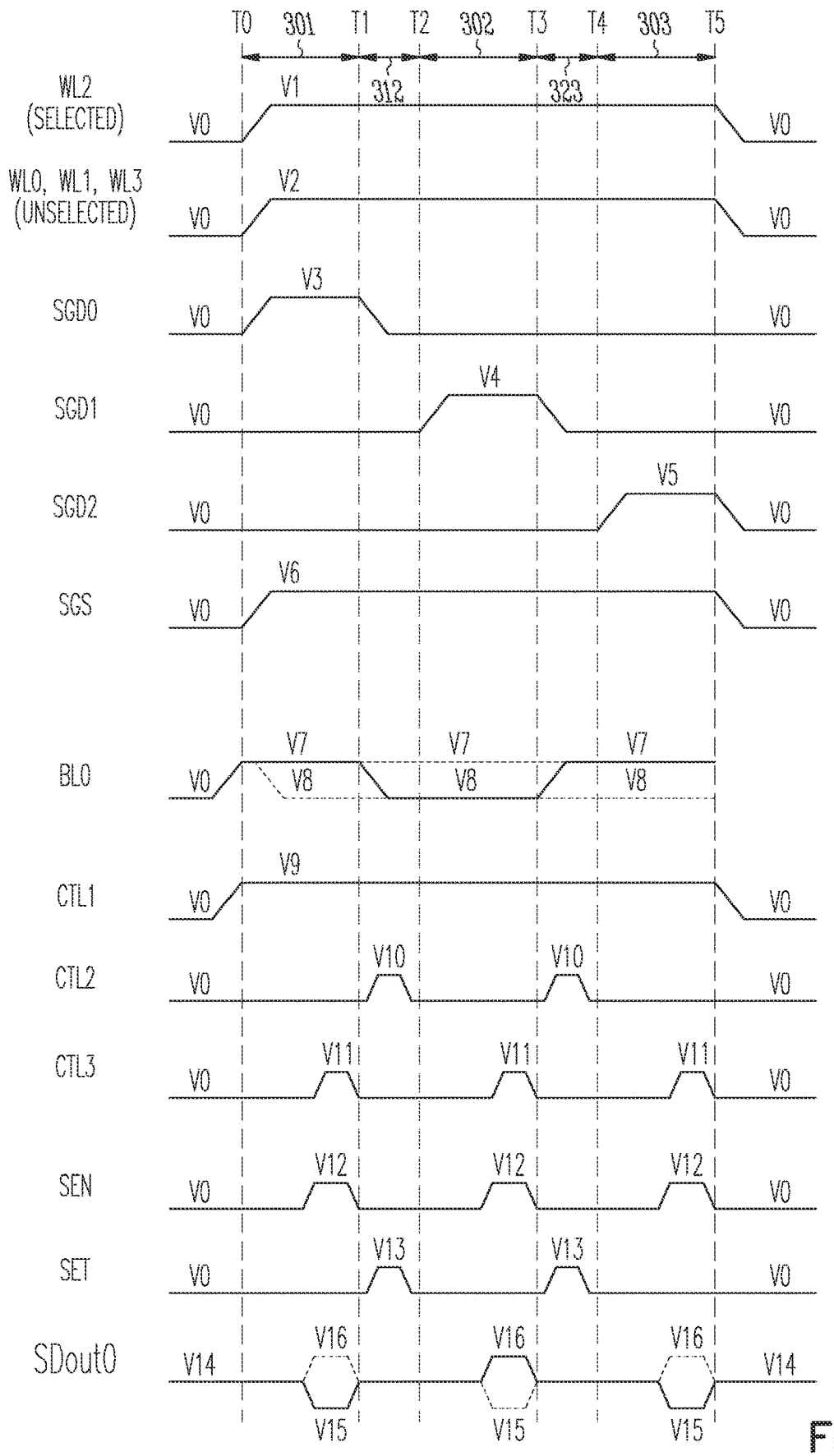
FIG. 3A is a timing diagram for the signals of FIG. 2A, FIG. 2B, and FIG. 2C during an example read operation of the memory device, according to an embodiment of the invention.

FIG. 3A is a timing diagram for the signals of FIG. 2A, FIG. 2B, and FIG. 2C during an example read operation of memory device 200, according to an embodiment of the invention. FIG. 3A shows different times T0 through T5 and different time 301, 302, 303, 312, and 323 during the example read operation of memory device 200. Time interval 301 can occur between times T0 and T1. Time interval 302 can occur between times T2 and T3. Time interval 303 can occur between times T4 and T5.

In FIG. 3A, time T0 can occur before time T5. Thus, time interval 301 can occur before time interval 302. Time interval 302 can occur before time interval 303. Time interval 312 can be between time intervals 301 and 302. Time interval 323 can be between time intervals 302 and 303.

V0 through V16 in FIG. 3A represent the different levels (e.g., voltage levels) that can be provided (e.g., applied) to the signals of memory device 200 during different time intervals of the example read operation.

Each of levels V0 through V16 can correspond to a voltage level. For example, level V0 can correspond to a voltage level having a ground potential (having a value of approximately zero volts, such as Vss in FIG. 1). Each of other levels V1 through V16 can correspond to a voltage level having a positive value (e.g., a value greater than ground potential). Some of levels V0 through V16 can have the same value. For example, levels V2, V3, V4, and V5 can have the same value (e.g., corresponding to the same voltage level, e.g., 5V). Levels V9, V10, and V11 can have the same value (e.g., Vcc). Level V1 can have a value different from the value of level V2. For example level V1 can have a value (e.g., 1V) less than the value of level V2 (e.g., 5V). In FIG. 3A, the waveforms including levels V0 through V16 are not scaled.

The example read operation associated with FIG. 3A assumes that access line 252a (FIG. 2A) is a selected access line in order to access selected groups of memory cells coupled to (selected) access line 252a and obtain information stored in the selected groups of memory cells. In this example, groups $212_0$, $212_1$, and $212_2$ of memory cells 212 are assumed to be the selected groups of memory cells (coupled to the selected access line 252a). Thus, in this example, sense amplifiers 244 (FIG. 2C) of buffer circuit 220, 221, and 222 can sense (e.g., concurrently sense) data lines 270, 271, and 272 and provide corresponding signals SDout0, SDout1, and SDout2 (FIG. 2C). For simplicity, only the waveform for SDout0 (associated with buffer circuit 220) is shown in FIG. 3A.

In the example read operation associated with FIG. 3A, signal WL2 associated with access line 252a (selected access line) can be referred to as the selected signal (as indicted in FIG. 3A). Signal WL0, WL1, and WL3 associated with access line 250a, 251a, and 253a (unselected access lines) can be referred to as unselected signals (as indicted in FIG. 3A).

At time T0 in FIG. 3A, signal WL2 can be activated set), such that the level of signal WL2 can be changed from level V0 to level V1. Signal WL2 can remain activated (e.g., can remain set) at the same level V1 between times T0 and T5. Signal WL2 may not be deactivated (e.g., may not be reset) at any time interval between times T0 and T5. At time T5, signal WL2 can be deactivated, such that the level of signal WL2 can be changed (e.g., reset) from level V1 to level V0. Thus, a read operation of memory device 200 can include activating (e.g., setting) the signal (e.g., WL2) associated with a selected access line (e.g., 252a) to cause the signal to have a certain level (e.g., V1) during the read operation, without changing (e.g., without resetting) the level of the signal to a different level, such as without changing (e.g., without resetting) the level (e.g., V1) of the signal back to the level (e.g., V0) that the signal has before it is activated.

Signals WL0, WL1, and WL3 can be activated (e.g., set) in a manner similar to that of signal WL2. For example, at time T0 in FIG. 3A, signals WL0, WL1, and WL3 can be activated, such that the level of signals WL0, WL1, and WL3 can be changed from level V0 to level V2. Signals WL0, WL1, and WL3 can remain activated (e.g., can remain set) at the same level V2 between times T0 and T5. Signals WL0, WL1, and WL3 may not be deactivated (e.g., may not be reset) at any time interval between times T0 and T5. At time T5, signals WL0, WL1, and WL3 can be deactivated, such that the level of signals WL0, WL1, and WL3 can be changed (e.g., reset) from level V2 to level V0. Thus, a read operation of memory device 200 can include activating (e.g., setting) the signals (e.g., WL0, WL1, and WL3) associated with unselected access lines (e.g., 250a, 251a, and 253a) to cause those signals to have a certain level (e.g., V2) during the read operation, without changing (e.g., without resetting) the level of those signals to a different level, such as without changing (e.g., without resetting) the level of the signals back to the level (e.g., V0) that those signals have before they are activated.

Signal SGS can be activated in a manner similar to that of signals WL0, WL1, and WL3. For example, at time T0 in FIG. 3A, signal SGS can be activated (e.g., set), such that the level of signal SGS can be changed from level V0 to level V6. Signal SGS can remain activated at the same level V6 between times T0 and T5. Signal SGS may not be deactivated at any time interval between times T0 and T5. At time T5, signal SGS can be deactivated (e.g., reset), such that the level of signal SGS can be changed from level V6 to level V0. Between times T0 and T5, in response to signal SGS being activated, transistors 261, 262, and 263 (FIG. 2A) can turn on to couple memory cell strings 231, 234, and 237 to line 299. Since signal SGS can remain activated between times T0 and T5, transistors 261, 262, and 263 can remain turned on between times T0 and T5. Thus, a read operation of memory device 200 can include activating (e.g., setting) the signal (e.g., SGS) associated with a select line (e.g., 280a) to cause the signal to have a certain level V6) during the read operation, without changing (e.g., without resetting) the level of the signal to a different level, such as without changing the level of the signal back to the level (e.g., V0) that the signal has before it is activated.

As shown in FIG. 3A, signals SGD0, SGD1, and SGD2 can be activated one at a time (e.g., sequentially activated) between times T0 and T5, such that only one of signals SGD0, SGD1, and SGD2 can be activated during a particular time interval while the other signals (among signals SGD0, SGD1, and SGD2) can be deactivated. For example, during time interval 301, signal SGD0 can be activated to level V3 while signals SGD1 and SGD2 can be deactivated (e.g., remain at level V0). During time interval 302, signal SGD1 can be activated to level V4 while signals SGD0 and SGD2 can be deactivated (e.g., remain at level V0). During time interval 303, signal SGD2 can be activated to level V5 while signals SGD0 and SGD1 can be deactivated (e.g., remain at level V0).

During time interval 301 (e.g., sense time interval), in response to signal SGD0 being activated, transistors 264 (FIG. 2A) can turn on to couple memory cell strings 231, 234, and 237 to data lines 270, 271, and 272, respectively. Sense amplifiers 244 (FIG. 2C) can sense data lines 270, 271, and 272 and provide sensed information to latches 245. Latches 245 (FIG. 2C) can latch the sensed information and provide it to an I/O circuit of memory device 200. The sensed information during time interval 301 can be based on the values of information stored in group $212_0$ of memory cells 212 (FIG. 2B), which are memory cells 212 from memory cell strings 231, 234, and 237 coupled to data lines 270, 271, and 272, respectively, during time interval 301.

During time interval 302 (e.g., sense time interval), in response to signal SGD1 being activated, transistors 265 (FIG. 2A) can turn on to couple memory cell strings 232, 235, and 238 to data lines 270, 271, and 272, respectively. Sense amplifiers 244 (FIG. 2C) can sense data lines 270, 271, and 272 and provide the sensed information to latches 245. Latches 245 can latch the sensed information and provide it to an I/O circuit of memory device 200. The sensed information during time interval 302 can be based on the values of information stored in group $212_1$ of memory cells 212 (FIG. 2B), which are memory cells 212 from memory cell strings 232, 235, and 238 coupled to data lines 270, 271, and 272, respectively, during time interval 302.

During time interval 303 (e.g., sense time interval), in response to signal SGD2 being activated, transistors 266 (FIG. 2A) can turn on to couple memory cell strings 233, 236, and 239 to data lines 270, 271, and 272, respectively. Sense amplifiers 244 (FIG. 2C) can sense data lines 270, 271, and 272 and provide the sensed information to latches 245. Latches 245 can latch the sensed information and provide it to an I/O circuit of memory device 200. The sensed information during time interval 303 can be based on the values of information stored in group $212_2$ of memory cells 212 (FIG. 2B), which are memory cells 212 from memory cell strings 233, 236, and 239 coupled to data lines 270, 271, and 272, respectively, during time interval 303.

The value of the sensed information can correspond to the levels of signals BL0, BL1, and BL2 (FIG. 2A and FIG. 2C). For simplicity, only the waveform of signal BL0 associated with data line 270 is shown in FIG. 3A.

Signal BL0 can have level V7 or level V8 during each of time intervals 301, 302, and 303 (e.g., sense time intervals). Level V7 can have a positive value, such as a positive voltage value (e.g., Vcc). Level V8 can have a positive value, such as a positive voltage value (e.g., a voltage value greater than ground potential and less than 0.5V).

During each of time intervals 301, 302, and 303, sense amplifier 244 (FIG. 2C) of buffer circuit 220 can sense data line 270 and provide sensed information. The level (e.g., V7 or V8) of signal BL0 during a particular time interval (e.g., one of time intervals 301, 302, and 303) can be based on the value of information stored in memory cell 212 of one of memory cell strings 231, 232, and 233 (FIG. 2A) that is coupled to data line 270 during that particular time interval.

For example, during time interval 301, memory cell 212 of memory cell string 231 can be coupled to data line 270 (because signal SDG0 is activated during time interval 301). Thus, during time interval 301, the level of signal BL0 can be based on the value of information stored in memory cell 212 of memory cell strings 231. For example, signal BL0 can have level V7 if the information stored in memory cell 212 of memory cell string 231 has one value (e.g., logic "0"). Signal BL0 can have level V8 if the information stored in memory cell 212 of memory cell string 231 has another value (e.g., logic "1").

During time interval 302, memory cell 212 of memory cell string 232 can be coupled to data line 270 (because signal SDG1 is activated during time interval 302). Thus, during time interval 302, the level of signal BL0 can be based on the value of information stored in memory cell 212 of memory cell string 232.

During time interval 303, memory cell 212 of memory cell string 233 can be coupled to data line 270 (because signal SDG2 is activated during time interval 303). Thus, during time interval 303, the level of signal BL0 can be based on the value of information stored in memory cell 212 of memory cell string 233.

Signal SDout0 can have a level corresponding to sensed information sensed by sense amplifier 244 of buffer circuit 220 during time intervals 301, 302, and 303. Signal SDout0 can have levels based on the levels of signal BL0. For example, signal SDout0 can have level V15 if signal BL0 has level V8 and level V16 if signal BL0 has level V7. During time interval 301, the level of signal SDout0 can be used to determine the value of information stored in memory cell 212 of memory cell string 231. For example, during time interval 301, if signal SDout0 has level V15, then the value of information stored in memory cell 212 of memory cell string 231 can be determined to be at one value (e.g., logic "0"). If signal. SDout0 has level V16, then the value of information stored in memory cell can be determined to be at another value (e.g., logic "1"). The level of signal SDout0 during time interval 302 can be used to determine the value of information stored in memory cell 212 of memory cell string 232. The level of signal SDout0 during time interval 303 can be used to determine the value of information stored in memory cell 212 of memory cell string 233.

As shown in FIG. 3A, signal CTL1 can be provided with level V9 between times T0 and T5 to turn on transistors 241 (FIG. 2C) during a time interval between times T0 and T5. Signal CTL2 can be provided with level V0 during time intervals 301, 302, and 303 to turn on transistor 242 during time intervals 301, 302, and 303. Data line 270 is coupled to node 247 when transistor 242 is turned on. Signal CTL2 can be provided with level V10 during time intervals 312 and 323 to turn off transistor 242 during time intervals 312 and 323. Data line 270 is decoupled from node 247 when transistor 242 is turned off. Signal CTL3 can be provided with level V11 during time intervals 301, 302, and 303 to turn on transistor 243 during time intervals 301, 302, and 303. Signal CTL3 can be provided with level V0 during time intervals 312 and 323 to turn off transistor 243 during time intervals 312 and 323.

Signal SET can be provided with level V13 during time intervals 312 and 323 to set latches 245 of buffer circuits 220, 221, and 222 (FIG. 2C) to a state (e.g., an initial state, such as zero). For example, during each of time intervals 301, 302, and 303, sense amplifiers 244 can perform a sensing stage to sense data lines 270, 271, and 272. Latches 245 can be set to an initial state during a time interval between two sensing stages. For example, latches 245 can be set to an initial state during time interval 312, which is between a sensing stage performed during time interval 301 and another sensing stage performed during time interval 302. In another example, latches 245 can be set to an initial state during time interval 323, which is a time interval between a sensing stage performed during time interval 302 and another sensing stage performed during time interval 303.

Memory device 200 may perform a memory operation of obtaining information stored in memory cells 210, 211, 212, and 213 without charging (e.g., without precharging) data lines 270, 271, and 272 between two sensing stages. For example, during each of time intervals 312 and 323, memory device 200 may not precharge data lines 270, 271, and 272 by, for example, not coupling data lines 270, 271, and 272 to a voltage source (e.g., to Vcc or to another positive voltage).

In the above description with reference to FIG. 2A, FIG. 2B, FIG. 2C, and FIG. 3A, groups $212_0$, groups $212_1$, and groups $212_2$ of memory cells 212 (FIG. 2B) coupled to access line 252a (associated with signal WL2) are selected to be accessed to obtain information from them during a read operation, as an example. Other groups of memory cells coupled to the same access line can also be selected and accessed in a manner similar to that used for groups $212_0$, groups $212_1$, and groups $212_2$ of memory cells 212 during the example read operation described above. For example, if groups $210_0$, groups $210_1$, and groups $210_2$ of memory cells 210 (FIG. 2B) coupled to access line 250a (associated with signal WL0) are selected to be accessed to obtain information from them during a read operation, then access line 250a and signal WL0 can be the selected access line and the selected signal, respectively; the other access lines 251a, 252a, and 253a can be unselected access lines. In this case, activities and operations to obtain information stored in groups $210_0$, groups $210_1$, and groups $210_2$ of memory cells 210 can be similar to those described above with reference to FIG. 2A, FIG. 2B, FIG. 2C, and FIG. 3A for groups $212_0$, groups $212_1$, and groups $212_2$ of memory cells 212.

Figure 3B:
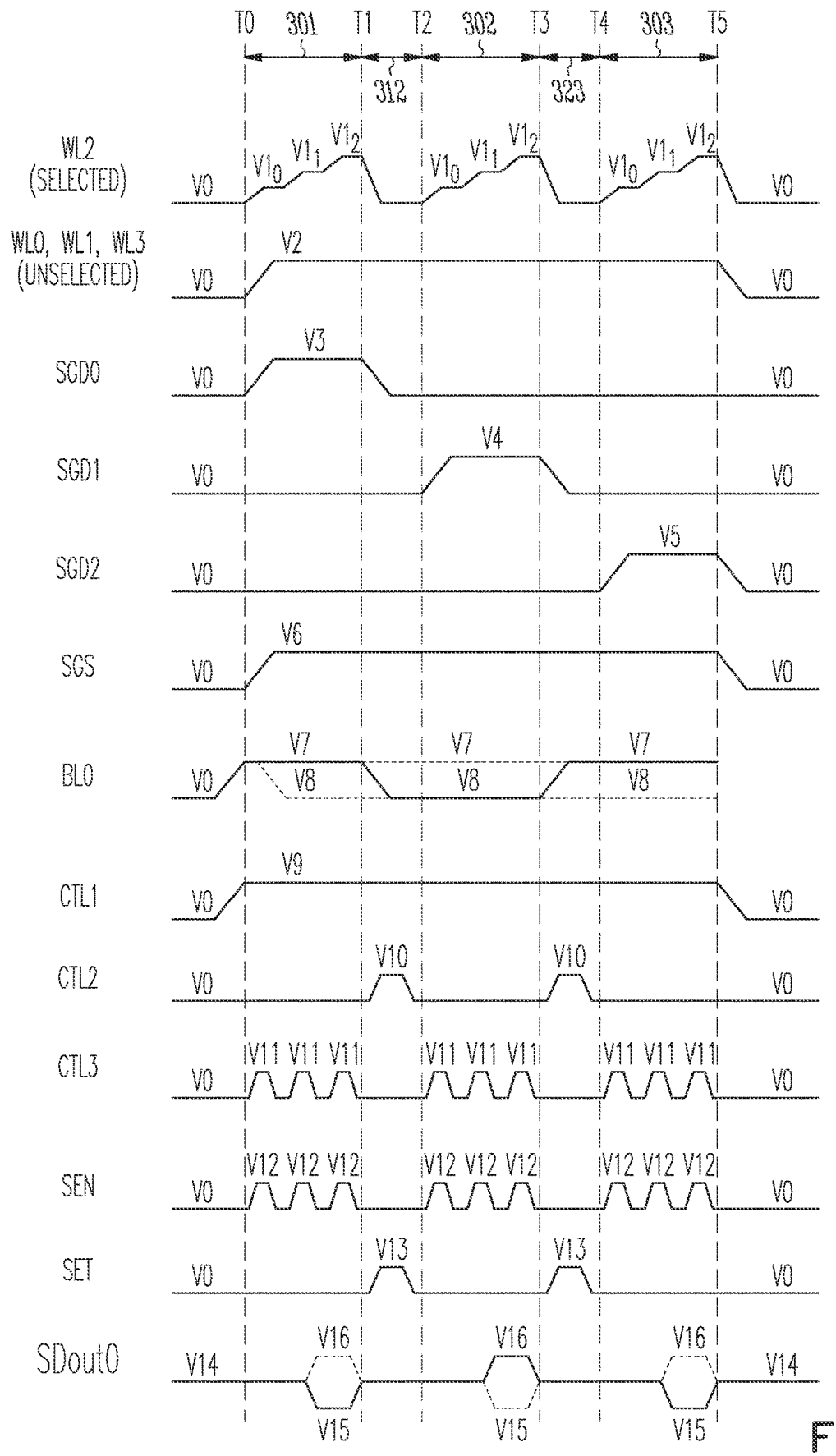
FIG. 3B is a timing diagram for the signals of FIG. 2A, FIG. 2B, and FIG. 2C during another example read operation of the memory device, according to an embodiment of the invention.

FIG. 3B is a timing diagram for the signals of FIG. 2A, FIG. 2B, and FIG. 2C during another example read operation of memory device 200, according to an embodiment of the invention. The timing diagram in FIG. 3A (described above) may be associated with memory device 200 when each of the memory cells (e.g., 210, 211, 212, and 213) of memory device 200 is configured as a single level cell. The timing diagram in FIG. 3B (described below) may be associated with memory device 200 when each of the memory cells (e.g., 210, 211, 212, and 213) of memory device 200 is configured as a multi-level cell (e.g., 2-bit per cell, for the example associated with FIG. 3B)

Figure 3C:
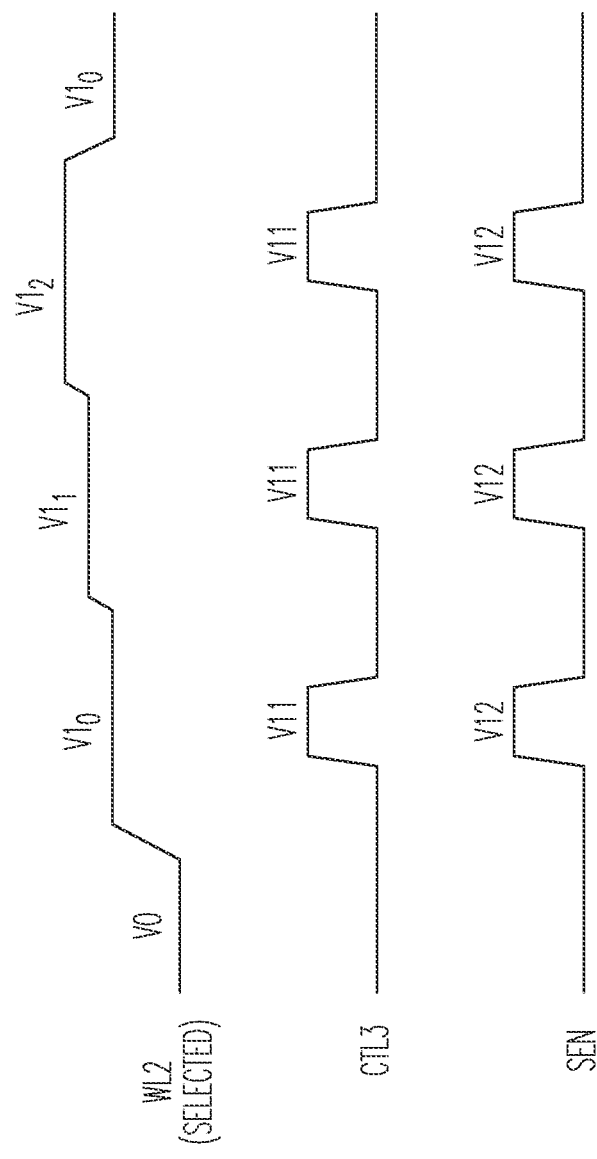
FIG. 3C shows an enlarged portion of some of the signals of FIG. 3B, according to an embodiment of the invention.

The differences between FIG. 3A and FIG. 3B include differences in the waveforms for signals WL2, signal CTL3, and signal SEN. FIG. 3C shows an enlarged portion of signals WL2, CTL3, and SEN of FIG. 3B. The waveforms for other signals (signals besides signals WL2, CTL3, and SEN) in FIG. 3B can be activated and deactivated in a manner similar to or identical to that described above with reference to FIG. 3A. Thus, for simplicity, the descriptions for the other signals for are not repeated in the description with reference to FIG. 3B.

As shown in FIG. 3B, signal WL2 can be activated (e.g., set) at time T0 from level V0 and can remain activated at level $V1_0$, $V1_1$, or $V1_2$ between times T0 and T5. Signal WL2 may not be deactivated (e.g., may not be reset back to level V0) at any time interval between times T0 and T5. FIG. 3B shows an example where signal WL2 can be provided with three different levels ($V1_0$, $V1_1$, and $V1_2$) during each of time intervals 301, 302, and 303 to indicate that each of memory cells 210, 211, 212, and 213 (FIG. 2A) of memory device 200 may be configured as a 2-bit per cell (e.g., each memory cell can store two bits). The number of different levels of signal WL2 during each of time intervals 301, 302, and 303 can vary. For example, if each of memory cells 210, 211, 212, and 213 of memory device 200 is configured as a 3-bit per cell (e.g., each memory cell can store three bits), then signal WL2 in FIG. 3B can be provided with seven different levels (e.g., $V1_0$ through $V1_6$).

As mentioned above, in the example associated with FIG. 3B, each of memory cells 210, 211, 212, and 213 of memory device 200 is configured as a 2-bit per cell. Thus, each of memory cells 210, 211, 212, and 213 can store one of four possible values of two bits, such as "00", "01", "10", or "11". In this example, memory device 200 can be configured to include four different threshold voltage (Vth) ranges (e.g., Vth distributions) associated with cells 210, 211, 212, and 213. The voltage value in each of the four Vth ranges can be used to represent one of four possible values of information stored in each memory cell. For example, memory device 200 can be configured to include four Vth ranges including $Vth_0$ range, $Vth_1$ range, $Vth_2$ range, and $Vth_3$ range to represent values "11", "10", "00", and "01", respectively, of two bits. $Vth_0$ range, $Vth_1$ range, $Vth_2$ range, and $Vth_3$ range can be arranged from a lower Vth range to a higher Vth range. For example, among these Vth ranges, $Vth_0$ range can be lowest Vth range (e.g., a lowest voltage value range) and $Vth_3$ range can be a highest Vth range (e.g., a highest voltage value range). Thus, values "11", "10", "00", and "01", in this order, can go from a lowest threshold voltage value to a highest threshold voltage value, with "11" corresponding to the lowest threshold voltage value. The order "11", "10", "00", and "01" is used as an example. Other orders can be used.

The different levels of signal WL2 during each of time intervals 301, 302, and 303 in FIG. 3B allows memory device 200 to determine the value of information stored in selected memory cells during a read operation in the example associated with FIG. 3B. The selected memory cells the example associated with FIG. 3B can be similar to those of the selected memory cells in the example associated with FIG. 3A. For example, the selected memory cells during time interval 301 in FIG. 3B can include memory cells 212 in group $212_0$ (FIG. 2B). The selected memory cells during time interval 302 in FIG. 3B can include memory cells 212 in group $212_1$ (FIG. 2B). The selected memory cells during time interval 303 in FIG. 3B can include memory cells 212 in group $212_2$ (FIG. 2B).

During each of time intervals 301, 302, and 303 in FIG. 3B, levels $V1_0$, $V1_1$, and $V1_2$ of signal WL2 can be used to determine the value of information stored in memory cells that are selected to obtain information stored in them. For example, level $V1_0$ of signal WL2 can be used to determine (e.g., judge) whether the Vth of a selected cell (which is selected to obtain information store in it) is less than $Vth_1$ range or at least equal to (equal to or greater than) a value in $Vth_1$ range. If the Vth of a selected cell is less than $Vth_1$ range, then the value of information stored in the selected memory cell can be determined to be corresponding to $Vth_0$ range (e.g., value "11"). If the Vth of a selected cell is at least equal to $Vth_1$ range, then level $V1_1$, level $V1_2$, or both (as described below) of signal WL2 can be used to determine the value of information (e.g., "00" or "01") stored in the selected memory cell.

Level $V1_1$ of signal WL2 in FIG. 3B can be used to determine whether the Vth of a selected cell is less than $Vth_2$ range or at least equal to a value in $Vth_2$ range. If the Vth of a selected cell is less than $Vth_2$ range, then the value of information stored in the selected memory cell can be determined to be corresponding to $Vth_1$ range (e.g., value "10"). If the Vth of a selected cell is at least equal to $Vth_2$ range, then level $V1_2$ of signal WL2 can be used to determine the value of information stored in the selected memory cell (e.g., "00" or "01")

Level $V1_2$ of signal WL2 in FIG. 3B can be used to determine whether the Vth of a selected cell is less than $Vth_3$ range or at least equal to a value in $Vth_3$ range. If the Vth of a selected cell is less than $Vth_3$ range, then the value of information stored in the selected memory cell can be determined to be corresponding to $Vth_2$ range (e.g., value "00"). If the Vth of a selected cell is at least equal to $Vth_3$ range, then the value of information stored in the selected memory cell can be determined to be corresponding to $Vth_3$ range (e.g., value "01").

As shown in FIG. 3C, during each of levels $V1_0$, $V1_1$, and $V1_2$ of signal WL2, signal CTL3 can be activated from level V0 to level V11 and signal CTL3 can be activated from level V0 to level V12. Sense amplifiers 244 (FIG. 2C) can sense data lines 270, 271, and 272 each time signal SEN is activated and provide sensed information to latches 245. Latches 245 (FIG. 2C) can latch the sensed information and provide it to the I/O circuit of memory device 200.

Providing a memory device, such as memory device 200, and operating the memory device during a memory operation (e.g., a read operation), as described above with reference to FIG. 1 through FIG. 3B, may improve power consumption of the memory device during the memory operation. The memory operation time used to obtain information stored in the memory cells of the memory device may also be improved. For example, since signals WL0, WL1, WL2, and WL3 (FIG. 3A) can remain activated (e.g., without resetting it to V0) during a memory operation (e.g., a read operation), one or both of power consumption and memory operation time may be reduced. Further, since data lines (e.g., 270, 271, and 272) of memory device 200 can be sensed to obtain information stored in different groups of memory cells without precharging the data lines between sensing stages, one or both of power consumption and memory operation tame may also be improved (e.g., reduced).

FIG. 4 shows a side view of a structure of a portion of a memory device 400, according to an embodiment of the invention. Memory device 400 can include a memory device described above with reference to FIG. 1 through FIG. 3C, such as memory device 200 (FIG. 2A). Thus, similar or identical elements (e.g., memory cells, data lines, control gates) between memory device 200 and memory device 400 are given the same designation labels.

As shown in FIG. 4, memory device 400 can include a substrate 490 where memory cell string 231 can be formed over substrate 490. FIG. 4 shows only one memory cell string 231. Other memory cell strings of memory device 400 can be formed over substrate 490 and can have a structure similar to or identical to that of memory cell string 231. Substrate 490 can include a monocrystalline (also referred to as single-crystal) semiconductor material (e.g., single-crystal silicon). The monocrystalline semiconductor material of substrate 490 can include impurities, such that substrate 490 can have a specific conductivity type (e.g., n-type or p-type).

As shown in FIG. 4, memory cells 210, 211, 212, and 213 can be located in different levels 421, 422, 423, and 424, respectively, in a z-direction of memory device 200. The z-direction can extend in a direction (e.g., vertical direction) associated with the thickness of substrate 490. FIG. 4 also shows an x-direction, which can extend in a direction (e.g., horizontal) perpendicular to the z-direction.

Memory cell string 231 can include a body 440 having a portion 441 coupled to data line 270 and a portion 442 coupled to line 299. Body 440 can include a conductive material that is capable of providing a conduction of current between data lines 270 and 299. Portions 441 and 442 can include materials of different conductivity types. For example, portion 441 can include a semiconductor material of n-type, and portion 442 can include a semiconductor material of p-type. The semiconductor material can include polycrystalline silicon.

Control gates 250b, 251b, 252b, and 253b can be located along at least a portion (e.g., portion 442) of body 440 in the z-direction. The materials of control gates 250b, 251b, 252b, and 253b can include a conductive material (e.g., conductively doped polycrystalline silicon or other conductive material).

Memory cell string 231 can include materials 403, 404, 405 between a portion of body 440 and each of control gates 250b, 251b, 252b, and 253b. Material 405 can also be between body 440 and each of gates 280b and 284b. As shown in FIG. 4, materials 403, 404, and 405 can be separated among memory cells 210, 211, 212, and 213.

Material 403 can include a charge blocking material(s) (e.g., a dielectric material such as silicon nitride) that is capable of blocking a tunnel of a charge.

Material 404 can include a charge storage material(s) that can provide a charge storage function to represent a value of information stored in memory cell 210, 211, 212, and 213. For example, material 404 can include conductively doped polycrystalline silicon, which can be either a p-type polycrystalline silicon or an n-type polycrystalline silicon. The polycrystalline silicon can be configured to operate as a floating gate (e.g., to store charge) in a memory cell (e.g., a memory cell 210, 211, 212, or 213).

Material 405 can include a tunnel dielectric material(s) (e.g., an oxide of silicon) that is capable of allowing tunneling of a charge (e.g., electrons).

Line 299 can be formed over substrate 490. Line 299 and portion 442 of body 440 can include materials of different conductivity types. For example, line 299 can include a semiconductor (e.g., polycrystalline silicon) material of n-type, and portion 442 can include a semiconductor (polycrystalline silicon) material of p-type.

Line 299 and portion 441 of body 440 can include materials of the same conductivity type (e.g., polycrystalline silicon of n-type). As shown in FIG. 4, portions 441 and 442 can contact each other and form a junction (e.g., p-n junction) 443. Portion 442 and line 299 can contact each other and form a junction (e.g., p-n junction) 444.

FIG. 4 shows line 299 formed over substrate 490 as an example. In an alternative arrangement, line 299 can be formed in a portion of substrate 490. For example, line 299 can be a part of substrate 490 that is doped with impurities to create a conductivity type (e.g., n-type or p-type) different from another part of substrate 490.

Memory device 400 can include buffer circuitry 420 located over (e.g., formed in or formed on) a portion of substrate 490. Buffer circuitry 420 can include buffer circuits, such as buffer circuits 220, 221, and 222 of memory device 200 (FIG. 2C). Memory device 400 can include conductive paths (not shown in FIG. 4) to couple buffer circuitry 420 to other elements of memory device 400 (e.g., data line 270). Memory device 400 can be configured to perform memory operations (e.g., read, write, and erase operation) similar to or identical to those described above with reference to FIG. 1 through FIG. 3C.

FIG. 5 shows a memory device 500, which can be variation of memory device 400 of FIG. 4, according to an embodiment of the invention. As shown in FIG. 5, memory device 500 can include elements that are similar to or identical to those of memory device 400 of FIG. 4. For simplicity, similar or identical elements between memory devices 400 and 500 are not repeated in the description with reference to FIG. 5. As shown in FIG. 5, materials 403, 404, and 405 are not separated (e.g., continuous) among memory cells 210, 211, 212, and 213. Material 404 of FIG. 5 can be different from material 404 of FIG. 4. For example, material 404 of FIG. 5 can include charge trapping materials, such as silicon nitride.

Figure 6:
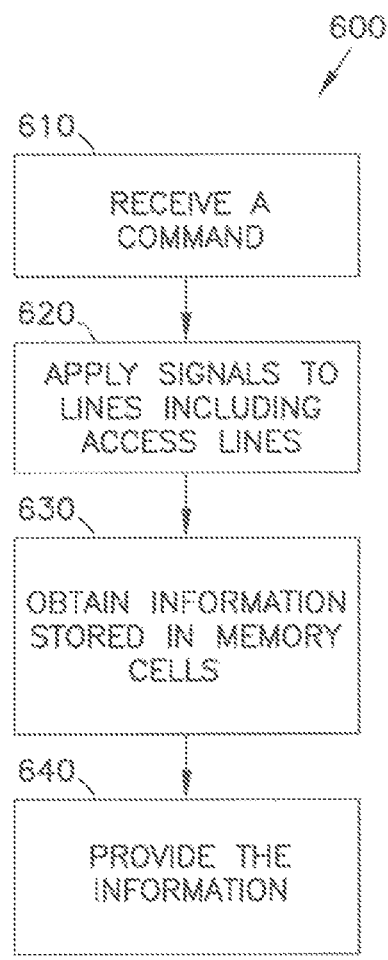
FIG. 6 is flow diagram for a method of performing a read operation in a memory device, according to an embodiment of the invention.

FIG. 6 is flow diagram for a method 600 of performing a read operation in a memory device, according to an embodiment of the invention. Method 600 can be used in a memory device such as memory device 100 (FIG. 1), memory device 200 (FIG. 2A, FIG. 29, and FIG. 2C), memory device 400, and memory device 500 (FIG. 5).

As shown in FIG. 6, activity 610 of method 600 can include receiving a command (e.g., a read command) to perform a memory operation (e.g., a read operation) of obtaining information stored in memory cells of the memory device. The command received in activity 610 can be provided to the memory device by a memory controller or a processor external to the memory device.

Activity 620 of method 600 can include applying signals to lines including access lines of the memory device during the memory operation. The access lines can include access lines 250a, 251a, 252a, and 253a of memory device 200 of FIG. 2A. The signals applied in activity 620 can include signals WL0, WL1, WL2, and WL3 (FIG. 2A).

In activity 620, applying the signals can include activating the signals, such that the levels of the signals can be changed from one level to another level. The signals can remain activated at the same level during the memory operation. The waveforms of the signals can be similar or identical to those of signals WL0, WL1, WL2, and WL3 shown in FIG. 3A. Thus, activity 620 can include activating (e.g., setting) the signals to cause the signals to have certain levels during the memory operation, without changing (e.g., without resetting) the levels of the signals to different levels, such as without changing the levels of the signals back to the levels (e.g., V0 in FIG. 3A) that the signals have before they are activated.

Activity 630 of method 600 can include obtaining information stored in memory cells of the memory device. Obtaining the information in activity 630 can include sensing data lines coupled to the selected groups of memory cells among the memory cells of the device and latching the sensed information. The groups of memory cells in activity can include groups $212_0$, $212_1$, and $212_1$ of memory cells 212 of FIG. 2C. Thus, obtaining the information in activity 630 can include activities and operations associated the example read operation described above with reference to FIG. 3A.

Activity 640 of method 600 can include providing the information obtained from the memory cell to other elements of the memory device, such as to an I/O circuit of the memory device.

Method 600 can include fewer or more activities relative to activities 610, 620, 630, and 640 shown in FIG. 6. For example, method 600 may include activities and operations of a read operation described above with reference to FIG. 1 through FIG. 3C.

The illustrations of the apparatuses (e.g., memory devices 100, 200, 400, and 500) and methods (e.g., method 600 and operations performed by memory devices 100, 200, 400, and 500) are intended to provide a general understanding of the structure of various embodiments and are not intended to provide a complete description of all the elements and features of an apparatus that might make use of the structures described herein.

The apparatuses (e.g., memory devices 100 and 200 or part of memory devices 100 and 200, including memory control unit 118 of FIG. 1, buffer circuitry 120 of FIG. 1, buffer circuits 220, 221, and 222 of FIG. 2A and FIG. 2C) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments.

Memory device 100, 200, 400, or 500 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 5 include apparatuses and methods for activating a signal associated with an access line coupled to different groups of memory cells during a memory operation of a device, and for sensing data lines of the device during different time intervals of the memory operation to determine the value of information stored in the memory cells. Each of the data lines can be coupled to a respective memory cell of each of the groups of memory cells. In at least one of such apparatuses and methods, the signal applied to the access line can remain activated during the memory operation. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   data lines;
   an access line;
   a first group of memory cells associated with the data lines and the access line;
   a second group of memory cells associated with the data lines and the access line; and
   a memory controller operable to apply positive voltage to the access line during a memory operation of obtaining information from the first group of memory cells and obtaining information from the second group of memory cells, and to abstain from coupling the access line to a ground potential during a time interval between obtaining the information from the first group of memory cells and obtaining information from the second group of memory cells.

2. The apparatus of claim 1, further comprising sense amplifiers coupled to respective data lines of the data lines, wherein the sense amplifiers are configured to refrain from precharging the respective data lines during the time interval between obtaining the information from the first group of memory cells and obtaining information from the second group of memory cells.

3. The apparatus of claim 2, wherein the first and second group of memory cells are formed over a substrate and the sense amplifiers are formed between the substrate and the first and second group of memory cells.

4. The apparatus of claim 1, wherein the first group of memory cells are included in different memory cell strings.

5. The apparatus of claim 4, wherein the second group of memory cells are included in different memory cell strings.

6. The apparatus of claim 1, further comprising sense amplifiers coupled to respective data lines of the data lines, wherein the sense amplifiers are configured to concurrently sense the respective data lines during obtaining information from the first group of memory cells.

7. The apparatus of claim 6, wherein the sense amplifiers are configured to concurrently sense the data lines during obtaining information from the second group of memory cells.

8. The apparatus of claim 6, further comprising latches coupled to respective sense amplifiers of the sense amplifiers, wherein the latches are configured to concurrently latch values of information stored in the first group of memory cells sensed by the sense amplifiers.

9. The apparatus of claim 8, wherein the latches are configured to concurrently latch values of information stored in the second group of memory cells sensed by the sense amplifiers.

10. The apparatus of claim 9, wherein the latches are configured to be set to a state during the time interval between obtaining the information from the first group of memory cells and obtaining information from the second group of memory cells.

11. An apparatus comprising:
    an access line;
    a data line;
    a first memory cell string coupled to the access line and the data line, the first memory cell string including memory cells located in different levels of the apparatus;
    a second memory cell string coupled to the access line and the data line, the second memory cell string including memory cells located in different levels of the apparatus; and
    a memory controller operable to couple a positive voltage to the access line during a memory operation of obtaining information from a first memory cell of the first memory cell string and obtaining information from a second memory cell of the second memory cell string, and to keep the access line coupled to the positive voltage during a time interval between obtaining the information from the first memory cell and obtaining the information from the second memory cell.

12. The apparatus of claim 11, wherein the memory controller is operable to refrain from coupling the data line to a voltage during the time interval between obtaining the information from the first memory cell and obtaining the information from the second memory cell.

13. The apparatus of claim 11, wherein the memory controller is operable to sequentially activate signals on respective select lines coupled to the first and second memory cell strings during obtaining the information from the first memory cell and obtaining the information from the second memory cell.

14. The apparatus of claim 13, the memory controller is operable to activate a signal on an additional select gate coupled to the first and second memory cell strings during obtaining the information from the first memory cell and obtaining the information from the second memory cell.

15. The apparatus of claim 11, further comprising an unselected access line associated with the first and second memory cell strings, wherein the memory controller is operable to couple the unselected access line to a positive voltage during the time interval between obtaining the information from the first memory cell and obtaining the information from the second memory cell.

16. An apparatus comprising:
data lines;
an access line;
a first group of memory cells associated with the data lines and the access line;
a second group of memory cells associated with the data lines and the access line; and
a memory controller operable to apply positive voltage to the access line during a read operation performed on the first group of memory cells and a read operation performed on the second group memory cells, to abstain from coupling the access line to a ground potential during a time interval between the read operation performed on the first group of memory cells and the read operation performed on the second group of memory cells, and to abstain from precharging the data lines during the time interval between the read operation performed on the first group of memory cells and the read operation performed on the second group of memory cells.

17. The apparatus of claim 16, wherein the memory controller is operable to sequentially activate signals on respective select lines coupled to the first and second groups of memory cells during the time interval between the read operation performed on the first group of memory cells and the read operation performed on the second group of memory cells.

18. The apparatus of claim 16, further comprising sense amplifiers coupled to respective data lines of the data lines, wherein the sense amplifiers are configured to concurrently sense the respective data lines during the read operation performed on the first group of memory cells.

19. The apparatus of claim 16, further comprising sense amplifiers coupled to respective data lines of the data lines, wherein the sense amplifiers are configured to concurrently sense the respective data lines during the read operation performed on the second group of memory cells.

20. The apparatus of claim 16, further comprising unselected access lines associated with the first and second group of memory cells, wherein the memory controller is operable to couple the unselected access lines to a positive voltage the time interval between the read operation performed on the first group of memory cells and the read operation performed on the second group of memory cells.

* * * * *